United States Patent
Ikeda et al.

(10) Patent No.: US 10,461,042 B2
(45) Date of Patent: Oct. 29, 2019

(54) SEMICONDUCTOR MODULE

(71) Applicant: SHINDENGEN ELECTRIC MANUFACTURING CO., LTD., Chiyoda-ku, Tokyo (JP)

(72) Inventors: Kosuke Ikeda, Saitama (JP); Yuji Morinaga, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/740,924

(22) PCT Filed: Jan. 31, 2016

(86) PCT No.: PCT/JP2016/052843
§ 371 (c)(1),
(2) Date: Dec. 29, 2017

(87) PCT Pub. No.: WO2017/130421
PCT Pub. Date: Aug. 3, 2017

(65) Prior Publication Data
US 2018/0226356 A1      Aug. 9, 2018

(51) Int. Cl.
*H01L 23/552* (2006.01)
*H01L 23/29* (2006.01)
(Continued)

(52) U.S. Cl.
CPC ............ *H01L 23/552* (2013.01); *H01L 23/29* (2013.01); *H01L 23/3121* (2013.01);
(Continued)

(58) Field of Classification Search
CPC ....... H01L 2224/32245; H01L 2224/33; H01L 2224/48137; H01L 2224/73265;
(Continued)

(56) References Cited

U.S. PATENT DOCUMENTS 6,081,028 A * 6/2000 Ettehadieh .............. H01L 23/42
257/687
6,495,914 B1 * 12/2002 Sekine ................ H01L 23/5389
257/723
(Continued)

FOREIGN PATENT DOCUMENTS

JP      10-12812 A      1/1998
JP      10-56131 A      2/1998
(Continued)

OTHER PUBLICATIONS

International Search Report in PCT/JP2016/052843, dated Apr. 19, 2016, 4pp.
(Continued)

*Primary Examiner* — Mohammed Shamsuzzaman
(74) *Attorney, Agent, or Firm* — Hauptman Ham, LLP

(57) ABSTRACT

A semiconductor module includes: a first substrate having a first insulating substrate and a first conductor layer; a power device part having a first electrode, a second electrode and a gate electrode; a second substrate having a second insulating substrate, a second conductor layer and a third conductor layer wherein a hole is formed in the second insulating substrate, the second conductor layer has a bonding portion and a surrounding wall portion; an inner resin portion; a control IC; and an outer resin portion, wherein the first substrate, the power device part, the second substrate and the control IC are stacked in this order, a connector is disposed in the inside of the hole, and the gate electrode is electrically connected to a control signal output terminal of the control IC through a connector.

8 Claims, 9 Drawing Sheets

(51) Int. Cl.
*H01L 23/48* (2006.01)
*H01L 25/18* (2006.01)
*H01L 23/373* (2006.01)
*H01L 23/482* (2006.01)
*H01L 25/065* (2006.01)
*H01L 23/433* (2006.01)
*H01L 23/31* (2006.01)
*H01L 23/498* (2006.01)
*H01L 25/16* (2006.01)

(52) U.S. Cl.
CPC ...... *H01L 23/3135* (2013.01); *H01L 23/3735* (2013.01); *H01L 23/4334* (2013.01); *H01L 23/48* (2013.01); *H01L 23/4822* (2013.01); *H01L 23/49833* (2013.01); *H01L 25/0657* (2013.01); *H01L 25/16* (2013.01); *H01L 25/162* (2013.01); *H01L 25/18* (2013.01); H01L 23/49811 (2013.01); H01L 2224/32245 (2013.01); H01L 2224/33 (2013.01); H01L 2224/48137 (2013.01); H01L 2224/73265 (2013.01); H01L 2225/06555 (2013.01); H01L 2225/06579 (2013.01); H01L 2225/06582 (2013.01); H01L 2225/06589 (2013.01); H01L 2924/19107 (2013.01)

(58) Field of Classification Search
CPC . H01L 2225/06555; H01L 2225/06579; H01L 2225/06582; H01L 2225/06589; H01L 23/29; H01L 23/3121; H01L 23/3135; H01L 23/3735; H01L 23/4334; H01L 23/48; H01L 23/4822; H01L 23/552; H01L 25/0657; H01L 25/07; H01L 25/18; H01L 2924/19107
See application file for complete search history.

(56) References Cited

U.S. PATENT DOCUMENTS

| | | | |
|---|---|---|---|
| 9,984,992 B2 * | 5/2018 | DeLaCruz | H01L 23/3121 |
| 10,181,457 B2 * | 1/2019 | Prabhu | H01L 24/19 |
| 2014/0251656 A1 * | 9/2014 | Ikeda | H05K 3/4676 174/251 |
| 2015/0250038 A1 * | 9/2015 | Sakuishi | H01L 27/1266 445/25 |
| 2016/0351641 A1 * | 12/2016 | Ito | H01L 27/1266 |
| 2017/0092568 A1 * | 3/2017 | Ikeda | H01L 25/071 |
| 2017/0133294 A1 * | 5/2017 | Ikeda | H01L 23/00 |
| 2018/0182745 A1 * | 6/2018 | Ikeda | H01L 23/4334 |

FOREIGN PATENT DOCUMENTS

| | | |
|---|---|---|
| JP | 11-97616 A | 4/1999 |
| JP | 2006-134990 A | 5/2006 |
| JP | 2008-103552 A | 5/2008 |
| JP | 2011-151103 A | 8/2011 |
| JP | 2013-69942 A | 4/2013 |
| WO | 2016/117075 A1 | 7/2016 |

OTHER PUBLICATIONS

International Search Report in PCT/JP2015/051655, dated Mar. 24, 2015, 4pp.

* cited by examiner

US 10,461,042 B2

SEMICONDUCTOR MODULE

RELATED APPLICATIONS

The present application is a National Phase of International Application Number PCT/JP2016/052843, filed Jan. 31, 2016.

TECHNICAL FIELD

The present invention relates to a semiconductor module.

BACKGROUND ART

Conventionally, there has been known a semiconductor module having a substrate and a semiconductor element (see patent literature 1, for example).

As shown in FIG. 9, the conventional semiconductor module 8 includes: a substrate 810 having an insulating substrate 811, a conductor layer 812 formed on one surface of the insulating substrate 811 and other conductor layers 813, 814 formed at positions spaced apart from the conductor layer 812; a device part (semiconductor element) 820 having a first electrode 821 on one surface (a lower surface in FIG. 9) and two second electrodes 822, 823 on the other surface (an upper surface in FIG. 9) and making the first electrode 821 and the conductor layer 812 bonded to each other; a wall portion 816 formed along an outer periphery of the insulating substrate 811; a resin portion 860 formed in a state where a resin is disposed in a recessed space which is defined by the insulating substrate 811 and the wall portion 816; a resin-made lid portion 862 disposed on an upper surface of the resin portion 860; and terminals 874, 876 for external connection where one-side ends of the terminals 874, 876 are electrically connected to the other conductor layers 813, 814, and the terminals 874, 876 extend toward the outside (vertically upward) through the resin portion 860 and the lid portion 862 from the one-side ends.

Out of two second electrodes 822, 823 of the semiconductor element 820, one second electrode 822 is electrically connected to the terminal 874 through a wire 870 and the other conductor layer 813, and the other second electrode 823 is electrically connected to the terminal 876 through a wire 872.

The conventional semiconductor module 8 has the resin portion 860 which is formed by disposing a resin in the recessed space defined by the substrate 810 and the wall portion 816 thus providing a semiconductor module having impact resistance.

Recently, in the technical field of semiconductor modules, there has been a demand for a semiconductor module where the structure for resin sealing can be easily formed.

Under such circumstances, inventors of the present invention have come up with a semiconductor module where the structure for resin sealing can be easily formed, and already filed international patent application PCT/JP2015/051655 (hereinafter, referred to as prior patent application) as a prior patent application.

As shown in FIG. 10, a semiconductor module 9 relating to the prior patent application includes:

a first substrate 910 having a first insulating substrate 911 and a first conductor layer 912 which is formed on at least one surface of the first insulating substrate 911; a device part (semiconductor element) 920 having a first electrode 921 on one surface thereof and a second electrode 922 on the other surface thereof and having the first electrode 921 bonded to the first conductor layer 912; a second substrate 930 having a second insulating substrate 931 and a second conductor layer 932 formed on at least one surface of the second insulating substrate 931, wherein the second conductor layer 932 has a bonding portion 933 bonded to the second electrode 922 and a surrounding wall portion 934 formed at a position which surrounds the bonding portion 933 as viewed in a plan view in a state where an upper end surface of the surrounding wall portion 934 projects from a bonding surface between the bonding portion 933 and the second electrode 922, and the second substrate 930 is brought into contact with the first substrate 910 by way of the surrounding wall portion 934; and a resin portion 940 made of a resin and disposed in a space defined by the surrounding wall portion 934 and sandwiched between the first insulating substrate 911 and the second insulating substrate 931.

In the semiconductor module 9 according to the prior patent application, the drive part 920 is disposed such that the whole device part 920 is positioned inside a region defined by the surrounding wall portion 934 as viewed in a plan view.

In the semiconductor module 9 according to the prior patent application, the second conductor layer 932 includes the surrounding wall portion 934 formed at the position which surrounds the bonding portion 933 as viewed in a plan view in a state where an upper end surface of the surrounding wall portion 934 projects from the bonding surface between the bonding portion 933 and the second electrode 922. Accordingly, it is unnecessary to additionally prepare a member for forming the structure for resin sealing (for example, the wall portion 816 in the conventional semiconductor module 8) and hence, the structure for resin sealing can be formed easily.

Further, in the semiconductor module 9 according to the prior patent application, the second electrode 922 of the device part 920 is bonded to the second conductor layer 932 formed on the one surface of the second insulating substrate 931. With such a configuration, in addition to the radiation of heat generated by the device part 920 to the outside through the first conductor layer 912 and the first insulating substrate 911, such heat can be radiated to the outside through the second conductor layer 932 and the second insulating substrate 931. Accordingly, as the semiconductor module 9 according to the prior patent application, it is possible to provide a semiconductor module having higher heat radiation property than conventional semiconductor modules.

CITATION LIST

Patent Literature

PTL 1: JP-A-2006-134990

SUMMARY OF INVENTION

Technical Problem

Recently, in a technical field of semiconductor modules, there has been requested a semiconductor module which satisfies a demand for miniaturization of a product. However, in such a semiconductor module, in the case where a power device part (power semiconductor element) having a gate electrode is used as a device part, and a control IC which controls the power device part is mounted on one surface side of a first insulating substrate, it is necessary to secure a region where the control IC is mounted on one surface side of the first insulating substrate and hence, an area occupied by parts is expanded. Accordingly, there arises a drawback that a semiconductor module which satisfies a demand for miniaturization of a product cannot be provided.

The present invention has been made to overcome the above-mentioned drawbacks, and it is an object of the present invention to provide a semiconductor module which satisfies a demand for miniaturization of a product even in the case where a semiconductor module includes a control IC which controls a power device part.

Solution to Problem

[1] A semiconductor module of the present invention includes: a first substrate having a first insulating substrate and a first conductor layer which is formed on one-surface side of the first insulating substrate; a power device part having a first electrode on one surface thereof and a second electrode and a gate electrode on the other surface thereof, and having the first electrode electrically connected to the first conductor layer; a second substrate having a second insulating substrate, a second conductor layer formed on one-surface side of the second insulating substrate and a third conductor layer formed on the other surface of the second insulating substrate, wherein a hole is formed in the second insulating substrate at a position corresponding to a position of the gate electrode, the second conductor layer has a bonding portion bonded to the second electrode and a surrounding wall portion formed at a position which surrounds the bonding portion as viewed in a plan view in a state where an upper end surface of the surrounding wall portion projects from a bonding surface between the second electrode and the bonding portion, and the second substrate is brought into contact with the first substrate byway of the surrounding wall portion; an inner resin portion made of a resin and disposed in a space defined by the surrounding wall portion and sandwiched between the first insulating substrate and the second insulating substrate; a control IC disposed on the third conductor layer; and an outer resin portion made of a resin and disposed on one surface side of the first substrate so as to cover the second substrate and the control IC, wherein the first substrate, the power device part, the second substrate and the control IC are stacked in this order, wherein a connecting member is disposed in the inside of the hole formed in the second insulating substrate, and the gate electrode is electrically connected to a control signal output terminal of the control IC through the connecting member.

In this specification, "a surrounding wall portion formed at a position which surrounds the bonding portion" includes not only the case where the surrounding wall portion is formed at a position which surrounds the whole circumference of the bonding portion as viewed in a plan view but also the case where the surrounding wall portion is formed only at a predetermined portion of the position which surrounds the bonding portion.

[2] In the semiconductor module of the present invention, it is preferable that the surrounding wall portion be formed at a position which surrounds the whole circumference of the bonding portion as viewed in a plan view.

[3] In the semiconductor module of the present invention, it is preferable that the surrounding wall portion be formed only at a predetermined portion of a position which surrounds the bonding portion as viewed in a plan view.

[4] In the semiconductor module of the present invention, it is preferable that the surrounding wall portion be formed continuously with the bonding portion, the first substrate further have a fourth conductor layer which is bonded to the surrounding wall portion at a position spaced apart from the first conductor layer on one-surface side of the first insulating substrate, and the fourth conductor layer be electrically connected to the second electrode through the surrounding wall portion and the bonding portion.

In this specification, "the surrounding wall portion is formed continuously with the bonding portion" includes not only the case where the surrounding wall portion is disposed adjacently to the bonding portion but also the case where a member which differs from the surrounding wall portion and the bonding portion is sandwiched between the surrounding wall portion and the bonding portion.

[5] In the semiconductor module of the present invention, it is preferable that a groove portion which engages with the surrounding wall portion be formed on the fourth conductor layer.

[6] In the semiconductor module of the present invention, it is preferable that the surrounding wall portion be formed in a state where the surrounding wall portion is spaced apart from the bonding portion.

[7] In the semiconductor module of the present invention, it is preferable that the first substrate further have a fourth conductor layer which is bonded to the surrounding wall portion at a position spaced apart from the first conductor layer on one-surface side of the first insulating substrate, and a groove portion which engages with the surrounding wall portion be formed on the fourth conductor layer.

[8] In the semiconductor module of the present invention, it is preferable that the power device part be formed of one semiconductor element, and the one semiconductor element have a first electrode on one surface thereof and have a second electrode and a gate electrode on the other surface thereof.

[9] In the semiconductor module of the present invention, it is preferable that the power device part have the structure where a plurality of semiconductor elements are stacked, and at least one semiconductor element among the plurality of semiconductor elements have a first electrode on one surface thereof and have a second electrode and a gate electrode on the other surface thereof.

In this specification, when two or more semiconductor elements respectively have the gate electrode, and the semiconductor elements are stacked in a state where the respective gate electrodes are displaced from each other such that the respective gate electrodes can be electrically connected to the connecting member.

[10] In the semiconductor module of the present invention, it is preferable that the power device part have the structure where a plurality of semiconductor elements are stacked, the first substrate further have a fifth conductor layer disposed at a position spaced apart from the first conductor layer, and the semiconductor module further have a second connecting member which has one end thereof sandwiched between two semiconductor elements among the plurality of semiconductor elements and has the other end thereof electrically connected to the fifth conductor layer.

[11] In the semiconductor module of the present invention, it is preferable that the power device part have the structure where a plurality of semiconductor elements are stacked, each of at least two semiconductor elements among the plurality of semiconductor elements have a first electrode on one surface thereof and have a second electrode and a gate electrode on the other surface thereof, and each of the at least two semiconductor elements be stacked such that the whole semiconductor element is positioned inside a region defined by the surrounding wall portion as viewed in a plan view.

[12] In the semiconductor module of the present invention, it is preferable that the power device part have the structure where a plurality of semiconductor elements are stacked, each of at least two semiconductor elements among the plurality of semiconductor elements have a first electrode on one surface thereof and have a second electrode and a gate electrode on the other surface thereof, and at least one of the at least two semiconductor elements be stacked such that the gate electrode of the semiconductor element is positioned outside a region defined by the surrounding wall portion as viewed in a plan view.

[13] In the semiconductor module of the present invention, it is preferable that the bonding portion and the surrounding wall portion be formed of one copper layer.

Advantageous Effects of Invention

According to the semiconductor module of the present invention, the first substrate, the power device part, the second substrate and the control IC are stacked in this order. Accordingly, even in the case where the semiconductor module includes the control IC which controls the power device part, it is unnecessary to secure a region where the control IC is mounted on one surface side of the first insulating substrate and hence, it is possible to narrow an area occupied by parts compared to the case where the control IC is mounted in a juxtaposed manner with the power device part on one surface side of the first insulating substrate. As a result, as the semiconductor module of the present invention, it is possible to provide a semiconductor module which satisfies a demand for miniaturization of a product.

Further, according to the semiconductor module of the present invention, a hole is formed in the second insulating substrate at a position corresponding to the position of the gate electrode, a connecting member is disposed in the inside of the hole formed in the second insulating substrate, and the gate electrode is electrically connected to a control signal output terminal of the control IC through the connecting member. Accordingly, even when the control IC is disposed on the third conductor layer, it is possible to control the power device part by the control IC without being obstructed by the second insulating substrate.

Further, according to the semiconductor module of the present invention, the connecting member is disposed in the inside of the hole formed in the second insulating substrate, and the gate electrode is electrically connected to the control signal output terminal of the control IC through the connecting member. Accordingly, a length of a line (a length of the connecting member) between the gate electrode of the power device part and the control signal output terminal of the control IC can be shortened and hence, the semiconductor module is minimally affected by noise from the outside.

Further, according to the semiconductor module of the present invention, the second conductor layer has the surrounding wall portion which is formed at the position which surrounds the bonding portion as viewed in a plan view. Accordingly, even in the case where the inner resin portion ignites due to the generation of heat which occurs as a result of applying an excessive load to the power device part, the surrounding wall portion plays a role of a fire wall so that spreading of fire to the surrounding can be prevented.

Still further, according to the semiconductor module of the present invention, the second conductor layer has the surrounding wall portion which is formed at the position which surrounds the bonding portion as viewed in a plan view. Accordingly, it is possible to shield the power device part from the outside by the surrounding wall portion and hence, it is possible to prevent the occurrence of a phenomenon that oscillations are generated or an erroneous operation occurs in the power device part due to noises from the outside of the power device part. As a result, it is possible to provide a semiconductor module where drawbacks caused by oscillations or an erroneous operation can be minimized as the semiconductor module of the present invention.

BRIEF DESCRIPTION OF DRAWINGS

FIG. 1A and FIG. 1B are views showing a semiconductor module 1 of an embodiment 1, wherein FIG. 1A is a cross-sectional view of the semiconductor module 1, and FIG. 1B is a planer cross-sectional view of the semiconductor module 1 taken along a line A-A in FIG. 1A.

FIG. 2A and FIG. 2B are views for describing a second substrate 30, wherein FIG. 2A is a plan view of the second substrate 30, and FIG. 2B is a cross-sectional view of the semiconductor module 2 taken along a line B-B in FIG. 2A.

FIG. 3A and FIG. 3B are views showing a semiconductor module 2 according to an embodiment 2, wherein FIG. 3A is a cross-sectional view of the semiconductor module 2, and FIG. 3B is a planer cross-sectional view of the semiconductor module 2 taken along a line C-C in FIG. 3A.

FIG. 5A and FIG. 5B are views showing a semiconductor module 4 according to an embodiment 4, wherein FIG. 5A is a cross-sectional view of the semiconductor module 4, and FIG. 5B is a planar cross-sectional view of the semiconductor module 4 taken along a line D-D in FIG. 5A.

FIG. 6A and FIG. 6B are views showing a semiconductor module 5 according to an embodiment 5, wherein FIG. 6A is a cross-sectional view of the semiconductor module 5, and FIG. 6B is a planar cross-sectional view of the semiconductor module 5 taken along a line E-E in FIG. 6A.

FIG. 7A and FIG. 7B are views showing a semiconductor module 6 according to an embodiment 6, wherein FIG. 7A is a cross-sectional view of the semiconductor module 6, and FIG. 7B is a planar cross-sectional view of the semiconductor module 6 taken along a line F-F in FIG. 7A.

DESCRIPTION OF EMBODIMENTS

Hereinafter, a semiconductor module of the present invention is described in conjunction with an embodiment shown in drawings.

Embodiment 1

1. Configuration of Semiconductor Module 1 of Embodiment 1

Figure 1A:
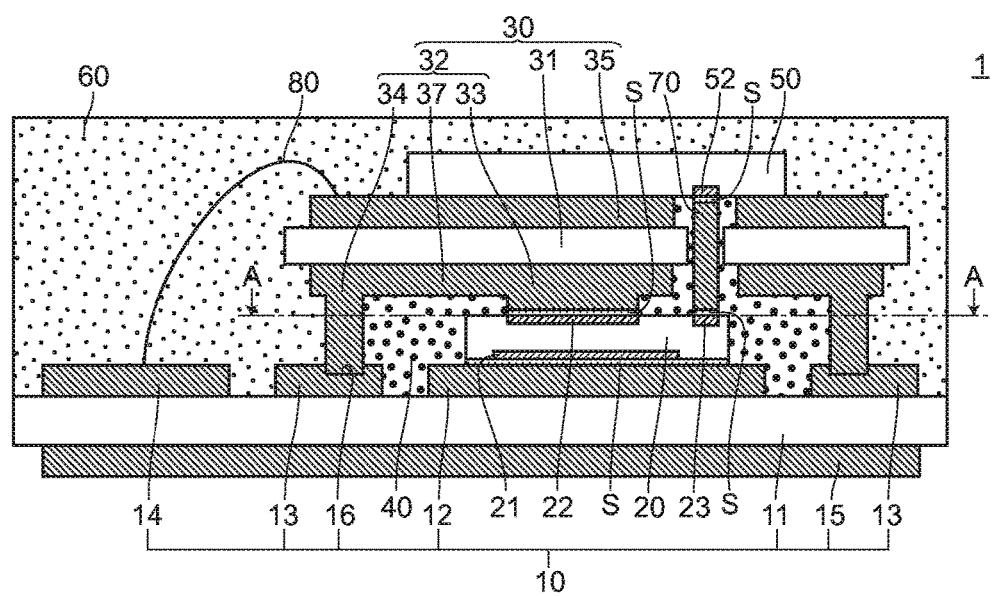

As shown in FIG. 1, a semiconductor module 1 of the embodiment 1 includes: a first substrate 10; a power device part; a second substrate 30; an inner resin portion 40; a control IC 50; an outer resin portion 60; and a connector (connecting member) 70. The first substrate 10, the power device part, the second substrate 30 and the control IC 50 are stacked in this order.

The first substrate 10 is a mounting substrate which has: a first insulating substrate 11; a first conductor layer 12 formed on one-surface side of the first insulating substrate 11; a fourth conductor layer 13 bonded to a surrounding wall portion 34 described later at a position spaced apart from the first conductor layer 12; an external-connection-use conductor layer 14 disposed at a position spaced apart from the first conductor layer 12 and the fourth conductor layer 13; and a heat radiation conductor layer 15 formed on the other surface of the first insulating substrate 11.

In the first substrate 10, the first insulating substrate 11 is made of ceramics (for example, alumina), while the first conductor layer 12, the fourth conductor layer 13, the external-connection-use conductor layer 14 and the heat radiation conductor layer 15 are made of metal (for example, copper). The first substrate 10 is a DCB substrate (direct copper bonding substrate) where the first insulating substrate 11 and the respective conductor layers are bonded to each other by eutectic bonding. With such a configuration, it is possible to provide the semiconductor module having high heat radiation property.

A groove portion 16 which engages with a surrounding wall portion 34 described later is formed on the fourth conductor layer 13. The groove portion 16 is formed by etching the fourth conductor layer 13. The external-connection-use conductor layer 14 is connected with an external circuit (not shown in the drawing), since a portion of the external-connection-use conductor layer 14 is not covered by an outer resin portion 60 or the external-connection-use conductor layer 14 is connected with a terminal for external connection (not shown in the drawing). The external-connection-use conductor layer 14 is electrically connected with an input terminal (or a control signal output terminal) of the control IC 50 through a third conductor layer 35 and a wire 80 described later.

The power device part is formed of one semiconductor element 20. A first electrode 21 is formed on one surface (a lower side in FIG. 1) of the semiconductor element 20, and a second electrode 22 and a gate electrode 23 are formed on the other surface (an upper side in FIG. 1) of the semiconductor element 20. The power device part is disposed such that the whole semiconductor element 20 is positioned inside a region defined by the surrounding wall portion 34 as viewed in a plan view. The semiconductor element 20 is a semiconductor element having three terminals (for example, IGBT).

The gate electrode 23 is electrically connected to a control signal output terminal 52 of the control IC 50 through the connector 70. The first electrode 21 is electrically connected to the first conductor layer 12 by bonding by a bonding material S (for example, solder), and the second electrode 22 is electrically connected to a bonding portion 33 of the second substrate 30 described later by bonding by the bonding material S (for example, solder).

Figure 1B:
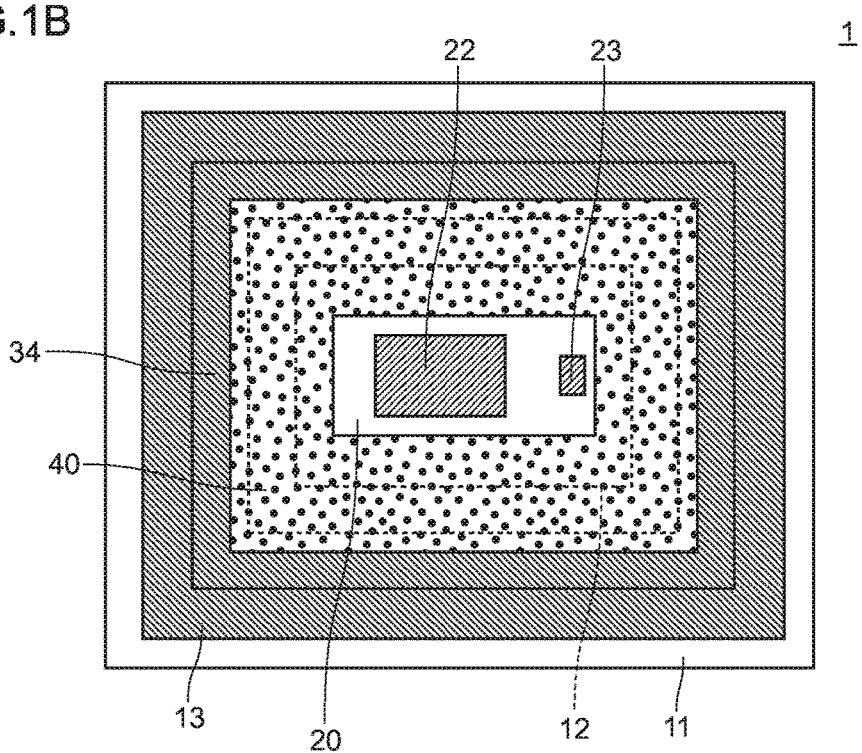
Figure 2A:
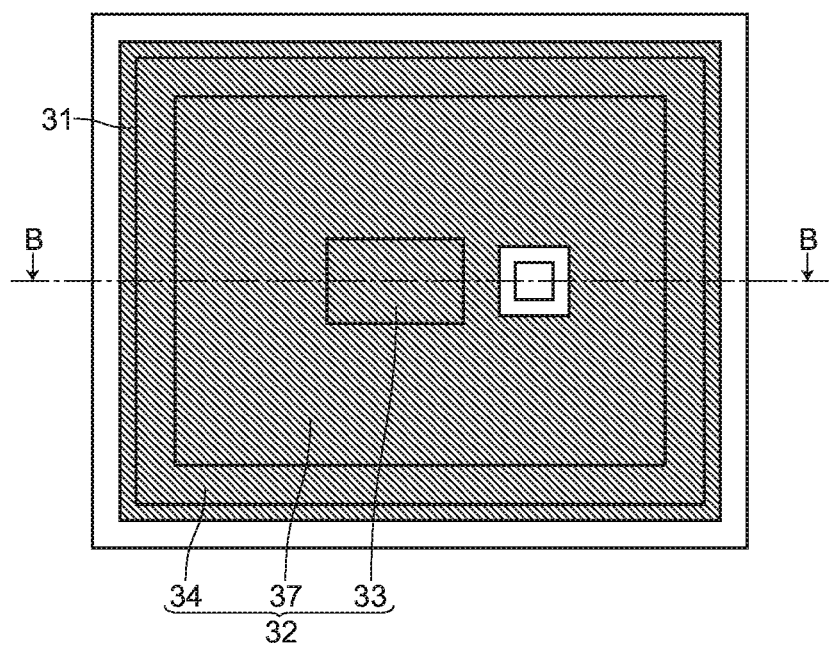
Figure 2B:
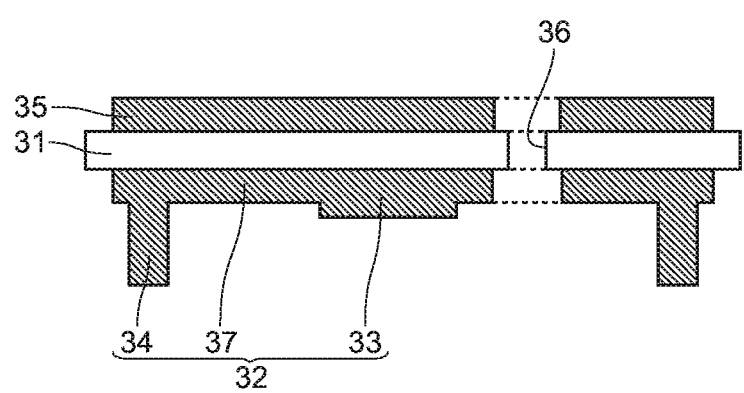

As shown in FIG. 1 and FIG. 2, the second substrate 30 has: a second insulating substrate 31; a second conductor layer formed on one-surface side of the second insulating substrate 31; and a third conductor layer 35 formed on the other surface of the second insulating substrate 31. In the second substrate 30, the second insulating substrate 31 is made of ceramics (for example, alumina) while the second conductor layer 32 and the third conductor layer 35 are made of metal (for example copper). The second substrate 30 is a DCB substrate where the second insulating substrate 31 and the respective conductor layers are bonded to each other by eutectic bonding.

As shown in FIG. 2, a hole 36 is formed in the second insulating substrate 31 (and the second conductor layer 32 and the third conductor layer 35) at a position corresponding to the position of the gate electrode 23.

As shown in FIG. 1 and FIG. 2, the second conductor layer 32 has: a bonding portion 33 which is bonded to the second electrode 22; a surrounding wall portion 34 which is formed at a position which surrounds the bonding portion 33 as viewed in a plan view in a state where an upper end surface of the surrounding wall portion 34 projects from a bonding surface between the second electrode 22 and the bonding portion 33; and a flat portion 37. The second substrate 30 is brought into contact with the first substrate 10 with the surrounding wall portion 34 interposed therebetween. The bonding portion 33 and the surrounding wall portion 34 are formed by etching one copper layer. With such a configuration, the bonding portion 33 and the surrounding wall portion 34 can be formed with high accuracy.

The surrounding wall portion 34 is formed at a position which surrounds the whole circumference of the bonding portion 33 as viewed in a plan view (see FIG. 1B). That is, the surrounding wall portion 34 has a "hollow square" shape as viewed in a plan view.

The surrounding wall portion 34 is formed continuously with the bonding portion 33 by way of the flat portion 37 of the second conductor layer 32. The surrounding wall portion 34 engages with the groove portion 16 formed on the fourth conductor layer 13 of the first substrate 10, and is bonded to the groove portion 16 by a bonding material (for example, solder). With such a configuration, the second electrode 22 and the fourth conductor layer 13 are electrically connected with each other through the bonding portion 33 and the surrounding wall portion 34.

A length from a boundary surface between the second insulating substrate 31 and the second conductor layer 32 to an upper end surface of the surrounding wall portion 34 is set to a value which falls within a range of from 0.2 to 1.0 mm, for example. A thickness of the bonding portion 33 is set to a value which falls within a range of from 0.15 to 0.5 mm, for example.

As shown in FIG. 1, the inner resin portion 40 is made of a resin disposed in "a space defined by the surrounding wall portion 34 and sandwiched between the first insulating substrate 11 and the second insulating substrate 31". As the resin which is used for forming the inner resin portion 40, a suitable resin (for example, an epoxy resin) can be used.

The control IC 50 controls driving of the power device part by controlling turning on or off of the gate electrode 23 of the power device part. The control IC 50 is disposed on the third conductor layer 35. The control IC 50 has a predetermined control signal output terminal 52, and the control signal output terminal 52 and the gate electrode 23 are electrically connected with each other through the connector 70 described later.

The outer resin portion 60 is made of a resin, and is disposed on one surface side of the first substrate 10 so as to cover at least the second substrate 30 and the control IC 50. Although a resin equal to a resin for forming the inner resin portion 40 is used as the resin for forming the outer resin portion 60, a resin which differs from the resin for forming the inner resin portion 40 can be also used.

The connector (connecting member) 70 is disposed in the inside of the hole 36 formed in the second insulating substrate 31. The connector 70 has an elongated columnar shape. One end of the connector 70 is electrically connected to the gate electrode 23 of the power device part, and the other end of the connector 70 is electrically connected to the control signal output terminal 52 of the control IC 50. The connector 70 is formed by blanking or bending a metal plate. As a material of the metal plate, a suitable material (for example, aluminum) can be used.

2. Advantageous Effects of Semiconductor Module 1 of Embodiment 1

According to the semiconductor module 1 of the embodiment 1, the first substrate 10, the power device part (semiconductor element 20), the second substrate 30 and the control IC 50 are stacked in this order. Accordingly, even in the case where the semiconductor module 1 includes the control IC 50 which controls the power device part, it is unnecessary to secure a region where the control IC 50 is mounted on one surface side of the first insulating substrate 11 and hence, it is possible to narrow an area occupied by parts compared to the case where the control IC 50 is mounted in a juxtaposed manner with the power device part on one surface side of the first insulating substrate 11. As a result, as the semiconductor module 1 of the embodiment 1, it is possible to provide a semiconductor module which satisfies a demand for miniaturization of a product.

Further, according to the semiconductor module 1 of the embodiment 1, the hole 36 is formed in the second insulating substrate 31 at a position corresponding to the position of the gate electrode 23, a connector 70 is disposed in the inside of the hole 36 formed in the second insulating substrate 31, and the gate electrode 23 is electrically connected to a control signal output terminal 52 of the control IC 50 through the connector 70. Accordingly, even when the control IC 50 is disposed on the third conductor layer 35, it is possible to control the power device part by the control IC 50 without being obstructed by the second insulating substrate 31.

Further, according to the semiconductor module 1 of the embodiment 1, the connector 70 is disposed in the inside of the hole 36 formed in the second insulating substrate 31, and the gate electrode 23 is electrically connected to the control signal output terminal 52 of the control IC 50 through the connector 70. Accordingly, a length of a line (a length of the connector 70) between the gate electrode 23 of the power device part and the control signal output terminal 52 of the control IC 50 can be shortened and hence, the semiconductor module 1 is minimally affected by noises from the outside.

Further, according to the semiconductor module 1 of the embodiment 1, the second conductor layer 32 has the surrounding wall portion 34 which is formed at the position which surrounds the bonding portion 33 as viewed in a plan view. Accordingly, in the case where the inner resin portion 40 ignites due to the generation of heat which occurs as a result of applying an excessive load to the power device part, the surrounding wall portion 34 plays a role of a fire wall so that spreading of fire to the surrounding can be prevented.

Still further, according to the semiconductor module 1 of the embodiment 1, the second conductor layer 32 has the surrounding wall portion 34 which is formed at the position which surrounds the bonding portion 33 as viewed in a plan view. Accordingly, it is possible to shield the power device part from the outside by the surrounding wall portion 34 and hence, it is possible to prevent the occurrence of a phenomenon that oscillations are generated or an erroneous operation occurs in the power device part due to noises from the outside of the power device part. As a result, it is possible to provide a semiconductor module where drawbacks caused by oscillations or an erroneous operation can be minimized as the semiconductor module 1 of the embodiment 1.

According to the semiconductor module 1 of the embodiment 1, the surrounding wall portion 34 is formed at a position which surrounds the whole circumference of the bonding portion 33 as viewed in a plan view. Accordingly, in the case where the inner resin portion 40 ignites due to the generation of heat which occurs as a result of applying an excessive load to the power device part, the surrounding wall portion 34 completely surrounds the inner resin portion 40 so that spreading of fire to the surrounding can be prevented with certainty. Further, it is possible to completely shield the power device part from the outside by the surrounding wall portion 34 and hence, it is possible to prevent with certainty the occurrence of a phenomenon that oscillations are generated or an erroneous operation occurs in the power device part due to noises from the outside of the power device part.

In the semiconductor module 1 of the embodiment 1, the surrounding wall portion 34 is formed continuously with the bonding portion 33, the first substrate 10 further includes a fourth conductor layer 13 which is bonded to the surrounding wall portion 34 at a position spaced apart from the first conductor layer 12 on one-surface side of the second insulating substrate 31, and the fourth conductor layer 13 is electrically connected to the second electrode 22 through the surrounding wall portion 34 and the bonding portion 33.

With such a configuration, the second electrode 22 of the power device part can be electrically connected to the outside through the bonding portion 33, the surrounding wall portion 34 and the fourth conductor layer 13. All of the bonding portion 33, the surrounding wall portion 34 and the fourth conductor layer 13 have larger cross-sectional areas and lower resistances than the wire and hence, when a large electric current is supplied to the semiconductor module, drawbacks minimally occur and hence, it is possible to provide a semiconductor module having further reliability.

According to the semiconductor module 1 of the embodiment 1, the semiconductor module 1 has the above-mentioned configuration and hence, heat generated by the power device part can be radiated to the outside through the bonding portion 33, the surrounding wall portion 34 and the fourth conductor layer 13 whereby it is possible to provide a semiconductor module having further heat radiation property.

According to the semiconductor module 1 of the embodiment 1, the groove portion 16 which engages with the surrounding wall portion 34 is formed on the fourth conductor layer 13. Accordingly, in steps of manufacturing the semiconductor module, at the time of mounting the second substrate 30 on the first substrate 10, it is possible to easily position the second substrate 30 by fitting the surrounding wall portion 34 of the second substrate 30 into the groove portion 16 of the fourth conductor layer 13.

According to the semiconductor module 1 of the embodiment 1, the power device part is formed of one semiconductor element 20, and the semiconductor element 20 has the first electrode 21 on one surface thereof and has the second electrode 22 and the gate electrode 23 on the other surface thereof. Accordingly, it is possible to provide a semiconductor module where a design of wiring can be performed easily.

According to the semiconductor module 1 of the embodiment 1, the bonding portion 33 and the surrounding wall portion 34 are formed of one copper layer. Accordingly, in the manufacturing steps of the semiconductor module, even when the semiconductor module 1 is introduced into a high temperature furnace for melting a bonding material (for example, solder), a length of the surrounding wall portion 34 minimally changes. Accordingly, a load applied to the second substrate 30 is dispersed to the surrounding wall portion 34 and hence, there is no possibility that the load applied to the second substrate 30 concentrates on the power device part. As a result, in the steps of manufacturing the semiconductor module, the power device part is minimally broken and hence, not only the semiconductor module can be manufactured at a high yield but also it is possible to prevent a change in thickness of a bonding material (for example, solder) even when the semiconductor module is introduced into a high temperature furnace for melting the bonding material and hence, it is possible to provide a highly reliable semiconductor module.

According to the semiconductor module 1 of the embodiment 1, the bonding portion 33 and the surrounding wall portion 34 are formed of one copper layer. Accordingly, there is no possibility that the surrounding wall portion 34 is inclined. Accordingly, in the steps of manufacturing the semiconductor module, there is no possibility that the second substrate 30 is rotated in the θ direction as viewed in a plan view and hence, it is possible to accurately position the second substrate 30.

Embodiment 2

Figure 3A:
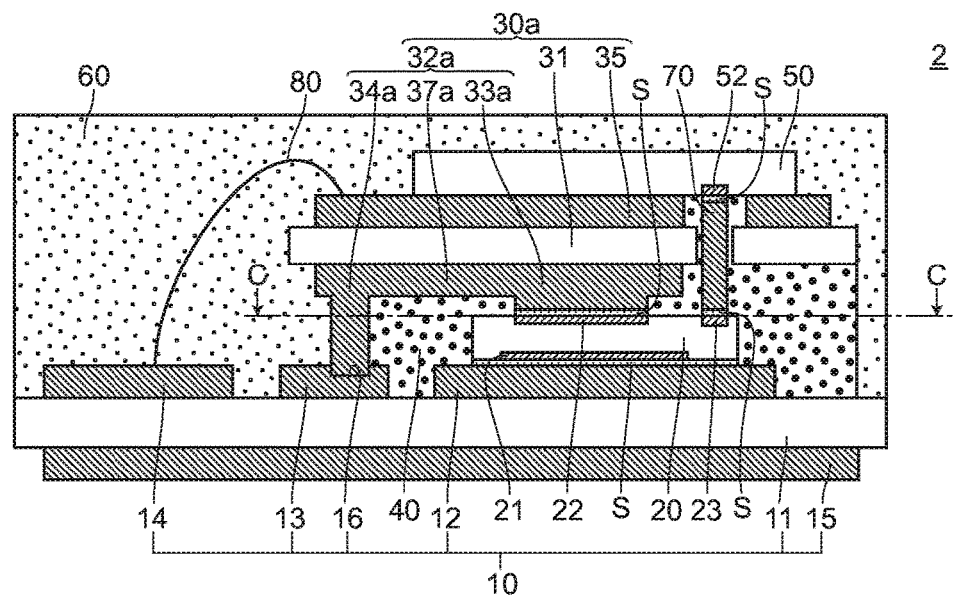
Figure 3B:
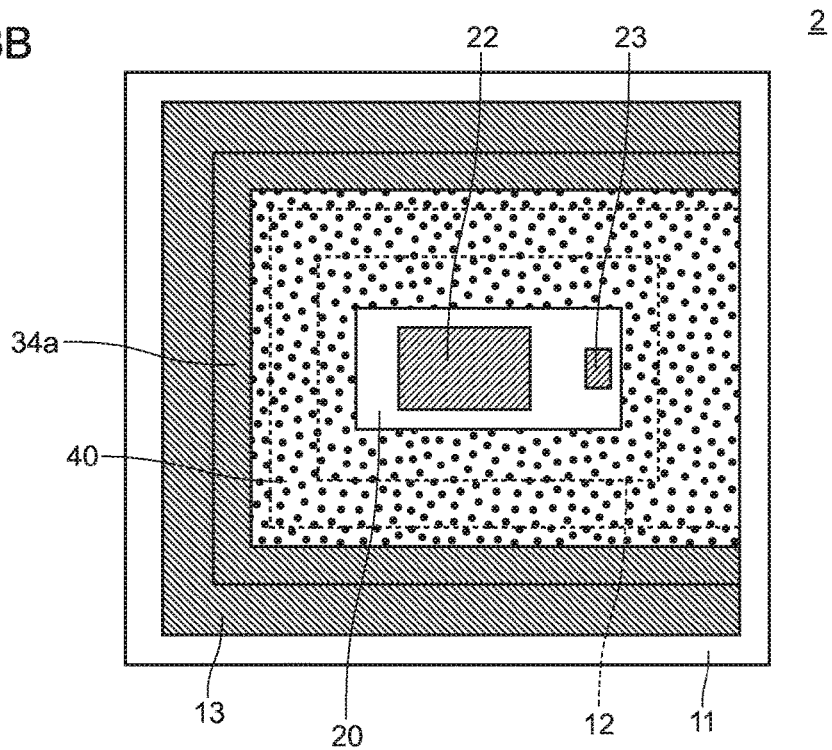

A semiconductor module 2 of the embodiment 2 has substantially the same configuration as the semiconductor module 1 of the embodiment 1. However, the semiconductor module 2 of the embodiment 2 differs from the semiconductor module 1 of the embodiment 1 with respect to the configuration of a surrounding wall portion. That is, in the semiconductor module 2 of the embodiment 2, as shown in FIG. 3, the surrounding wall portion 34 is formed only at a predetermined portion of the position which surrounds a bonding portion 33 as viewed in a plan view (the position which surrounds ¾ of the whole circumference of the bonding portion 33) (see FIG. 3B). That is, the surrounding wall portion 34 has a U shape as viewed in a plan view.

In this manner, the semiconductor module 2 of the embodiment 2 differs from the semiconductor module 1 of the embodiment 1 with respect to the configuration of the surrounding wall portion. However, in the same manner as the semiconductor module 1 of the embodiment 1, a first substrate 10, a power device part (semiconductor element 20), a second substrate 30a and a control IC 50 are stacked in this order. Accordingly, even in the case where the semiconductor module includes the control IC 50 which controls the power device part, it is unnecessary to secure a region where the control IC 50 is mounted on one surface side of a first insulating substrate 11 and hence, it is possible to narrow an area occupied by parts compared to the case where the control IC 50 is mounted in a juxtaposed manner with the power device part on one surface side of the first insulating substrate 11. As a result, as the semiconductor module 2 of the embodiment 2, it is possible to provide a semiconductor module which satisfies a demand for miniaturization of a product.

According to the semiconductor module 2 of the embodiment 2, the surrounding wall portion 34a is formed only at a predetermined portion of the position which surrounds the bonding portion 33 as viewed in a plan view. Accordingly, in forming the inner resin portion 40, a resin can be filled into a space defined by the surrounding wall portion 34 and sandwiched between a first insulating substrate 11 and a second insulating substrate 31 through "a space sandwiched by the first insulating substrate 11 and the second insulating substrate 31 at the portion of the position which surrounds a bonding portion 33 as viewed in a plan view where the surrounding wall portion 34 is not formed".

The semiconductor module 2 of the embodiment 2 has substantially the same configuration as the semiconductor module 1 of the embodiment 1 with respect to points except for the configuration of the surrounding wall portion. Accordingly, out of the advantageous effects which the semiconductor module 1 of the embodiment 1 acquires, the semiconductor module 2 of the embodiment 2 can acquire advantageous effects brought about by the substantially same configuration.

Embodiment 3

Figure 4:
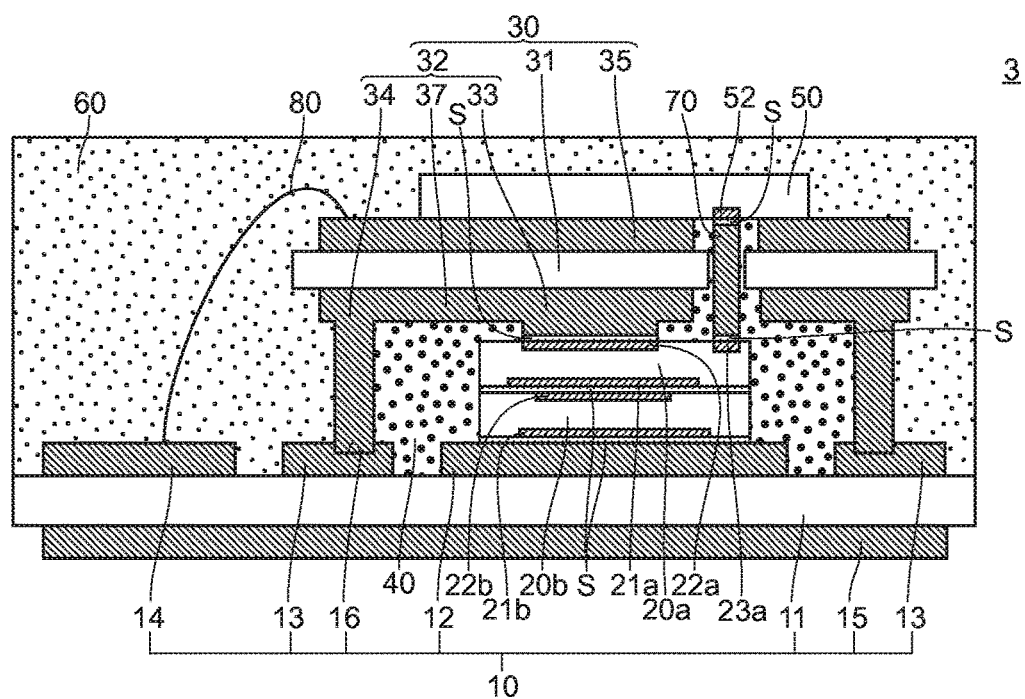
FIG. 4 is a cross-sectional view showing a semiconductor module 3 according to an embodiment 3.

A semiconductor module 3 of the embodiment 3 has substantially the same configuration as the semiconductor module 1 of the embodiment 1. However, the semiconductor module 3 of the embodiment 3 differs from the semiconductor module 1 of the embodiment 1 with respect to the configuration of a power device part. That is, in the semiconductor module 3 of the embodiment 3, as shown in FIG. 4, the power device part has the structure where two semiconductor elements 20a, 20b are stacked.

In the semiconductor module of the embodiment 3, the power device part has the structure where the semiconductor element 20a having three terminals are stacked on the semiconductor element 20b having two terminals.

In the semiconductor element 20a having three terminals, a first electrode 21a formed on one surface (lower surface) of the semiconductor element 20a is electrically connected to a second electrode 22b of the semiconductor element 20b, a second electrode 22a formed on the other surface (upper surface) of the semiconductor element 20a is electrically connected to a bonding portion 33a having three terminals, and a gate electrode 23a is electrically connected to a control signal output terminal 52 of a control IC 50 through a connector 70.

In the semiconductor element 20b having two terminals, a first electrode 21b formed on one surface (lower surface) of the semiconductor element 20b is electrically connected to a first conductor layer 12, and a second electrode 22b formed on the other surface (upper surface) of the semiconductor element 20b is electrically connected to the first electrode 21a of the semiconductor element 20a having three terminals.

In this manner, the semiconductor module 3 of the embodiment 3 differs from the semiconductor module 1 of the embodiment 1 with respect to the configuration of the power device part. However, in the same manner as the semiconductor module 1 of the embodiment 1, a first substrate 10, the power device part (semiconductor elements 20a, 20b), a second substrate 30 and the control IC 50 are stacked in this order. Accordingly, even in the case where the semiconductor module includes the control IC 50 which controls the power device part, it is unnecessary to secure a region where the control IC 50 is mounted on one surface side of a first insulating substrate 11 and hence, it is possible to narrow an area occupied by parts compared to the case where the control IC 50 is mounted in a juxtaposed manner with the power device part on one surface side of the first insulating substrate 11. As a result, as the semiconductor module 3 of the embodiment 3, it is possible to provide a semiconductor module which satisfies a demand for miniaturization of a product.

Still further, in the semiconductor module 3 of the embodiment 3, the power device part has the structure where two semiconductor elements 20a, 20b are stacked. Accordingly, it is possible to narrow an area occupied by parts compared to the case where two semiconductor elements 20a, 20b are mounted in a juxtaposed manner on one surface side of the first insulating substrate 11. As a result, it is possible to provide a semiconductor module which satisfies a demand for miniaturization of a product at a high level.

The semiconductor module 3 of the embodiment 3 has substantially the same configuration as the semiconductor module 1 of the embodiment 1 with respect to points except for the configuration of the power device part. Accordingly, out of the advantageous effects which the semiconductor module 1 of the embodiment 1 acquires, the semiconductor module 3 of the embodiment 3 can acquire advantageous effects brought about by the substantially same configuration.

Embodiment 4

Figure 5A:
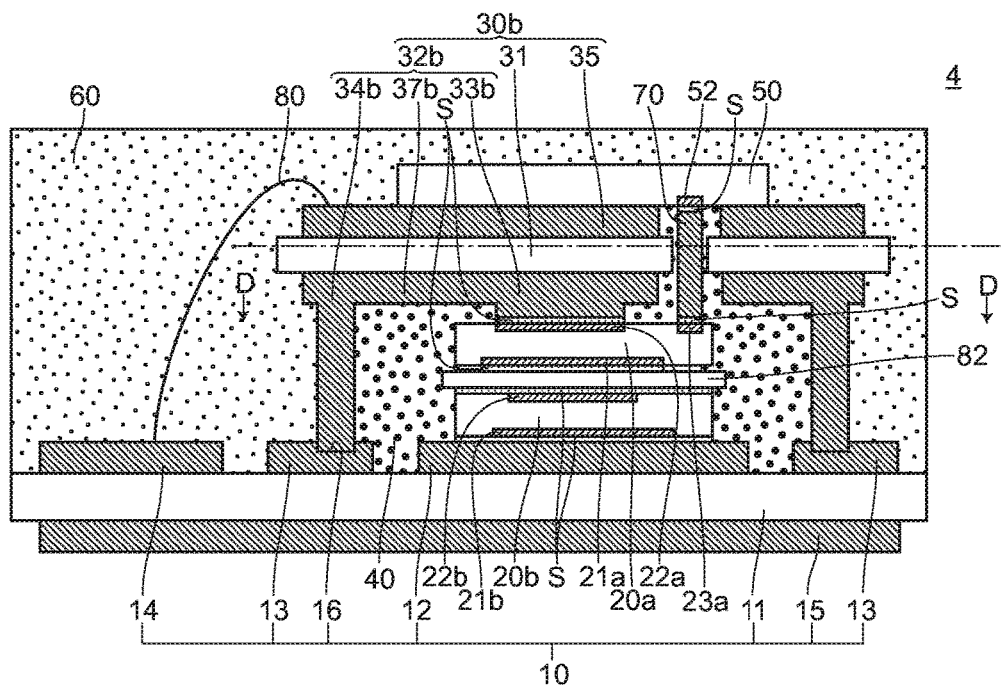

A semiconductor module 4 of the embodiment 4 has substantially the same configuration as the semiconductor module 3 of the embodiment 3. However, the semiconductor module 4 of the embodiment 4 differs from the semiconductor module 3 of the embodiment 3 with respect to a point where the semiconductor module 4 includes a second connecting member. That is, in the semiconductor module 4 of the embodiment 4, as shown in FIG. 5, the semiconductor module 4 includes the second connecting member 82 having one end thereof sandwiched between two semiconductor elements 20a, 20b and the other end thereof electrically connected to a fifth conductor layer 17 described later.

The second connecting member 82 is formed by blanking or bending a metal plate (for example, aluminum plate). One end of the second connecting member 82 is formed one size larger than two semiconductor elements 20a, 20b as viewed in a plan view, an upper side (second substrate side) at one end of the second connecting member 82 is bonded to a first electrode 21a of the semiconductor element 20a by a bonding material (solder), and a lower side (first substrate side) at one end of the second connecting member 82 is bonded to a second electrode 22b of the semiconductor element 20b by a bonding material (solder).

A first substrate 10 further includes a fifth conductor layer 17 disposed at a position spaced apart from both of a first conductor layer 12 and an external-connection-use conductor layer 14. The fifth conductor layer 17 is connected with an external circuit (not shown in the drawing), since a portion of the fifth conductor layer 17 is not covered by an outer resin portion 60 or the fifth conductor layer 17 is connected with a terminal for external connection (not shown in the drawing).

Figure 5B:
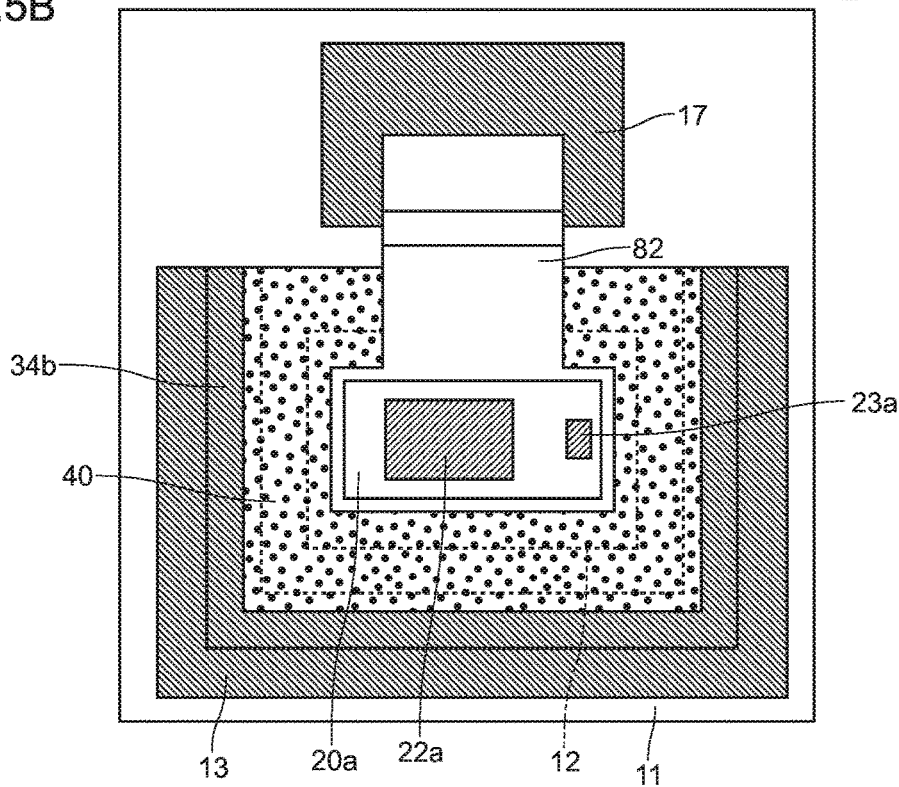

The surrounding wall portion 34b is formed only at a predetermined portion of the position which surrounds a bonding portion 33b as viewed in a plan view (a position which surrounds ¾ of the whole circumference of the bonding portion 33) (see FIG. 5B). That is, the surrounding wall portion 34b has a U shape as viewed in a plan view. The second connecting member 82 is formed such that the second connecting member 82 passes through "a space sandwiched by a first insulating substrate 11 and a second insulating substrate 31b at the position which surrounds the bonding portion 33b as viewed in a plan view and where the surrounding wall portion 34b is not formed".

In this manner, the semiconductor module 4 of the embodiment 4 differs from the semiconductor module 3 of the embodiment 3 with respect to a point where the semiconductor module 4 includes the second connecting member. However, in the same manner as the semiconductor module 3 of the embodiment 3, the first substrate 10, the power device part (semiconductor elements 20a, 20b), a second substrate 30b and a control IC 50 are stacked in this order. Accordingly, even in the case where the semiconductor module includes the control IC 50 which controls the power device part, it is unnecessary to secure a region where the control IC 50 is mounted on one surface side of the first insulating substrate 11 and hence, it is possible to narrow an area occupied by parts compared to the case where the control IC 50 is mounted in a juxtaposed manner with the power device part on one surface side of the first insulating substrate 11. As a result, as the semiconductor module 4 of the embodiment 4, it is possible to provide a semiconductor module which satisfies a demand for miniaturization of a product.

Further, according to the semiconductor module 4 of the embodiment 4, the semiconductor module 4 includes the second connecting member 82 having one end thereof sandwiched between two semiconductor elements 20a, 20b and the other end thereof electrically connected to the fifth conductor layer 17. Accordingly, it is possible to provide the semiconductor module having the higher degree of freedom in design.

The semiconductor module 4 of the embodiment 4 has substantially the same configuration as the semiconductor module 3 of the embodiment 3 with respect to points except for the point where the semiconductor module 4 includes the second connecting member. Accordingly, out of the advantageous effects which the semiconductor module 3 of the embodiment 3 acquires, the semiconductor module 4 of the embodiment 4 can acquire advantageous effects brought about by the substantially same configuration.

Embodiment 5

Figure 6A:
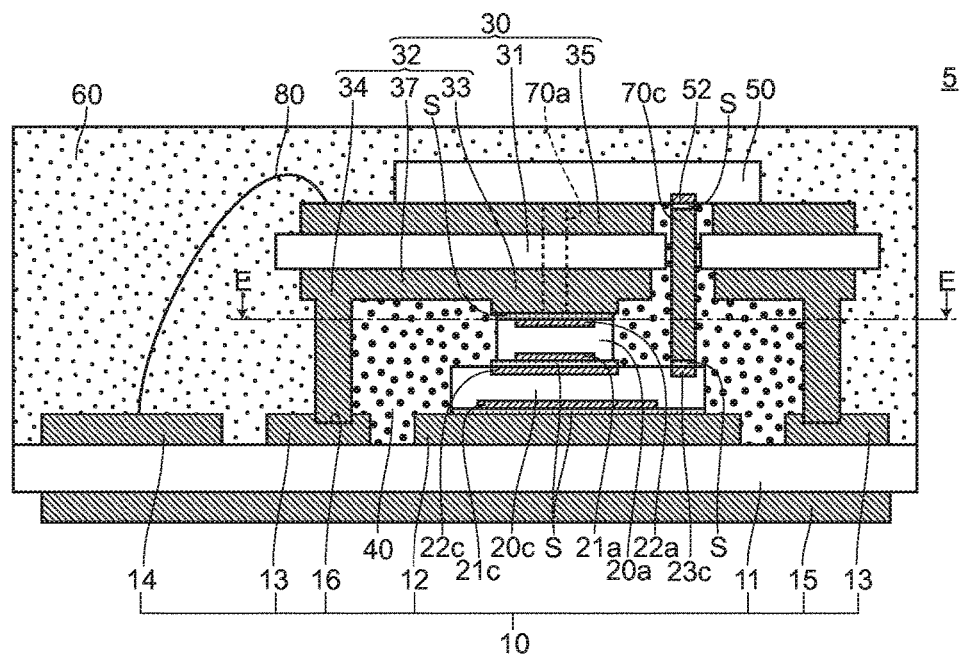
Figure 6B:
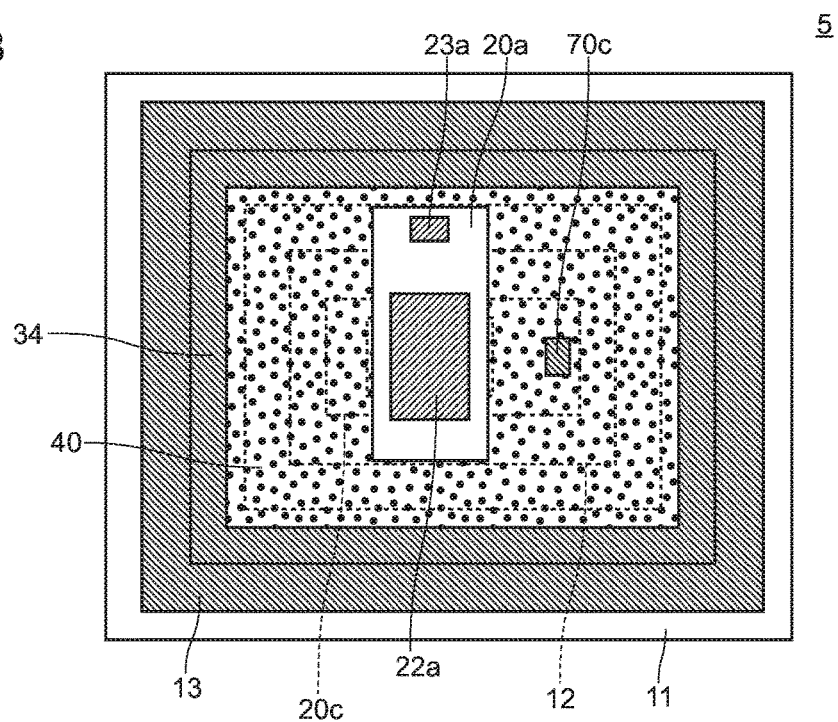

A semiconductor module 5 of the embodiment 5 has substantially the same configuration as the semiconductor module 3 of the embodiment 3. However, the semiconductor module 5 of the embodiment 5 differs from the semiconductor module 3 of the embodiment 3 with respect to the configuration of a power device part. That is, in the semiconductor module 5 of the embodiment 5, as shown in FIG. 6, both of two semiconductor elements 20a, 20c (assuming the semiconductor element on a second substrate side as the semiconductor element 20a and the semiconductor element on a first substrate side as the semiconductor element 20c) have a first electrode 21a, 21c on one surface and a second electrode 22a, 22c and two gate electrodes 23a, 23c on the other surface.

Each of the two semiconductor elements 20a, 20c is stacked such that the whole semiconductor element is positioned inside a region defined by a surrounding wall portion 34 as viewed in a plan view.

A second insulating substrate 31 has holes which respectively correspond to the gate electrodes 23a, 23c of two semiconductor elements 20a, 20c, and connectors 70a, 70c are disposed in the inside of the respective holes.

In this manner, the semiconductor module 5 of the embodiment 5 differs from the semiconductor module 3 of the embodiment 3 with respect to the configuration of the power device part. However, in the same manner as the semiconductor module 3 of the embodiment 3, a first substrate 10, the power device part (semiconductor elements 20a, 20c), a second substrate 30 and a control IC 50 are stacked in this order. Accordingly, even in the case where the semiconductor module includes the control IC 50 which controls the power device part, it is unnecessary to secure a region where the control IC 50 is mounted on one surface side of the first insulating substrate 11 and hence, it is possible to narrow an area occupied by parts compared to the case where the control IC 50 is mounted in a juxtaposed manner with the power device part on one surface side of the first insulating substrate 11. As a result, as the semiconductor module 5 of the embodiment 5, it is possible to provide a semiconductor module which satisfies a demand for miniaturization of a product.

Further, according to the semiconductor module 5 of the embodiment 5, each of the two semiconductor elements 20*a*, 20*c* is stacked such that the whole semiconductor element is positioned inside a region defined by the surrounding wall portion 34 as viewed in a plan view. Accordingly, it is possible to completely shield the two semiconductor elements 20*a*, 20*c* by the surrounding wall portion 34 from the outside. As a result, it is possible to prevent with certainty the occurrence of a phenomenon that oscillations are generated or an erroneous operation occurs in the two semiconductor elements 20*a*, 20*c* due to noises from the outside.

The semiconductor module 5 of the embodiment 5 has substantially the same configuration as the semiconductor module 3 of the embodiment 3 with respect to points except for the configuration of the power device part. Accordingly, out of the advantageous effects which the semiconductor module 3 of the embodiment 3 acquires, the semiconductor module 5 of the embodiment 5 can acquire advantageous effects brought about by the substantially same configuration.

Embodiment 6

Figure 7A:
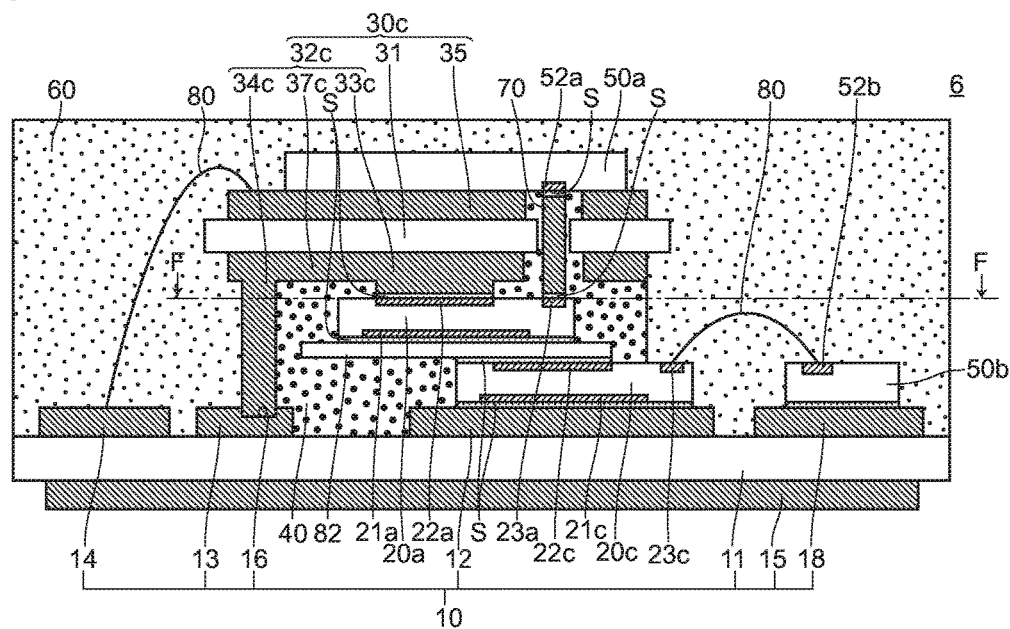

A semiconductor module 6 of the embodiment 6 has substantially the same configuration as the semiconductor module 5 of the embodiment 5. However, the semiconductor module 6 of the embodiment 6 differs from the semiconductor module 5 of the embodiment 5 with respect to the configuration of a power device part. That is, in the semiconductor module 6 of the embodiment 6, as shown in FIG. 7, one of the two semiconductor elements (semiconductor element 20*c* on a lower side) is stacked such that a gate electrode 23*c* of a semiconductor element 20*c* is positioned outside a region defined by a surrounding wall portion 34*c* as viewed in a plan view.

The semiconductor module 6 of the embodiment 6 further includes a second connecting member 82 having one end thereof sandwiched between two semiconductor elements 20*a*, 20*c* and the other end thereof electrically connected to a fifth conductor layer 17. One end of the second connecting member 82 is formed one size larger than semiconductor elements 20*a*, 20*c* as viewed in a plan view, an upper side (second substrate side) at one end of the second connecting member 82 is bonded to a first electrode 21*a* of the semiconductor element 20*a* by a bonding material (solder), and a lower side (first substrate side) at one end of the second connecting member 82 is bonded to a second electrode 22*c* of the semiconductor element 20*c* by a bonding material (solder).

Figure 7B:
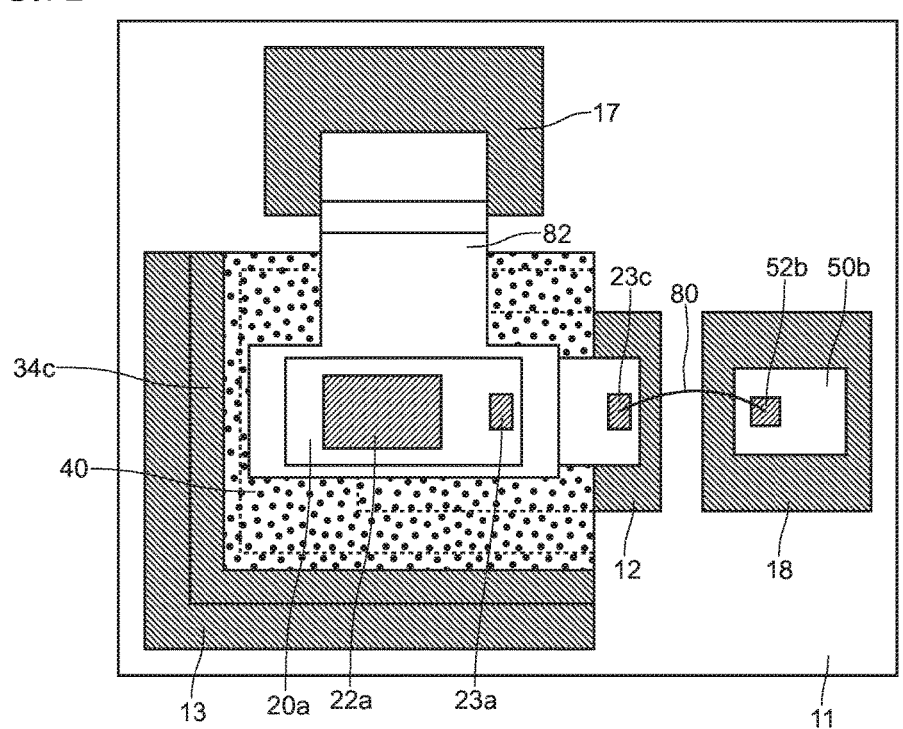

The surrounding wall portion 34*c* is formed only at a predetermined portion of the position which surrounds a bonding portion 33*c* as viewed in a plan view (a position which surrounds a half of the whole circumference of the bonding portion 33 as viewed in a plan view) (see FIG. 7B). That is, the surrounding wall portion 34*c* has an L shape as viewed in a plan view.

The gate electrode 23*c* of the semiconductor element 20*c* (on a lower side) is electrically connected with a control signal output terminal 52*b* of a control IC 50*b* disposed at a position spaced apart from the surrounding wall portion 34*c* through a wire 80.

In a predetermined direction perpendicular to an outer periphery of the surrounding wall portion 34*c*, it is preferable that the gate electrode 23*c* be away from an outer periphery of a region defined by the surrounding wall portion 34*c* as viewed in a plan view three times as large as a width of the gate electrode 23*c* in the predetermined direction. With such a configuration, a straight line distance between the wire 80 which connects the gate electrode 23*c* and the control signal output terminal 52*c* of the control IC 50*b* to each other and the surrounding wall portion 34*c* becomes long and hence, short-circuiting minimally occurs.

In this manner, the semiconductor module 6 of the embodiment 6 differs from the semiconductor module 5 of the embodiment 5 with respect to the configuration of the power device part. However, in the same manner as the semiconductor module 5 of the embodiment 5, a first substrate 10, the power device part (semiconductor elements 20*a*, 20*c*), a second substrate 30*c* and the control IC 50*b* are stacked in this order. Accordingly, even in the case where the semiconductor module includes the control IC 50*a* which controls the power device part, it is unnecessary to secure a region where the control IC 50*a* is mounted on one surface side of a first insulating substrate 11 and hence, it is possible to narrow an area occupied by parts compared to the case where the control IC 50*a* is mounted in a juxtaposed manner with the power device part on one surface side of the first insulating substrate 11. As a result, as the semiconductor module 6 of the embodiment 6, it is possible to provide a semiconductor module which satisfies a demand for miniaturization of a product.

According to the semiconductor module 6 of the embodiment 6, the gate electrode 23*c* of the semiconductor element 20*c* is stacked such that the gate electrode 23*c* is positioned outside a region defined by the surrounding wall portion 34*c* as viewed in a plan view. Accordingly, even in the case where the second substrate 30*c* is provided over the most portion of the power device part, the gate electrode 23*c* of the power device part and the control signal output terminal 52*b* of the control IC 50*b* can be connected with each other by the wire 80 having a small diameter. As a result, as the semiconductor module 6 of the embodiment 6, it is possible to provide a semiconductor module capable of controlling the power device part (the semiconductor element 20*c* on a lower side of the power device part) by the control IC 50*b*.

The semiconductor module 6 of the embodiment 6 has substantially the same configuration as the semiconductor module 5 of the embodiment 5 with respect to points except for the configuration of the power device part. Accordingly, out of the advantageous effects which the semiconductor module 5 of the embodiment 5 acquires, the semiconductor module 6 of the embodiment 6 can acquire advantageous effects brought about by the substantially same configuration.

Embodiment 7

Figure 8:
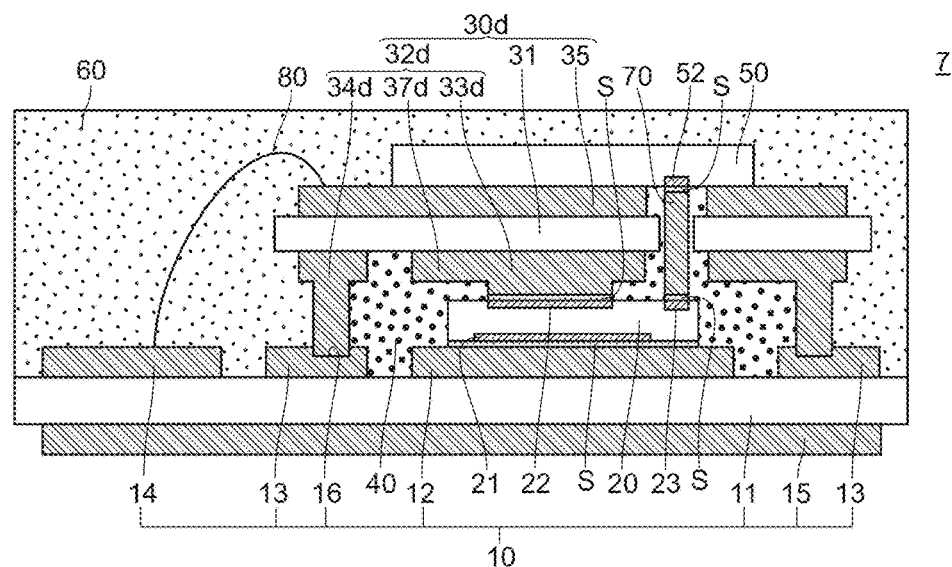
FIG. 8 is a cross-sectional view showing a semiconductor module 7 according to an embodiment 7.
Figure 9:
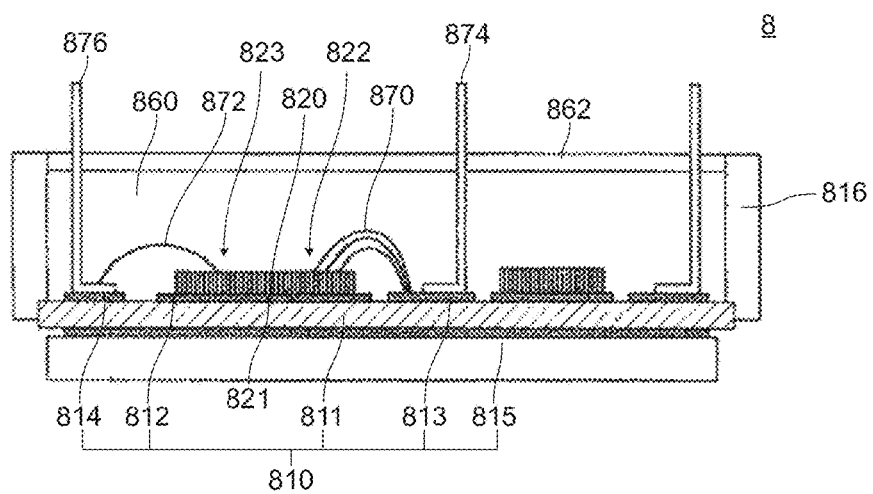
FIG. 9 is a cross-sectional view showing a conventional semiconductor module 8, wherein symbol 815 indicates a heat radiation conductor layer of a substrate 810.
Figure 10:
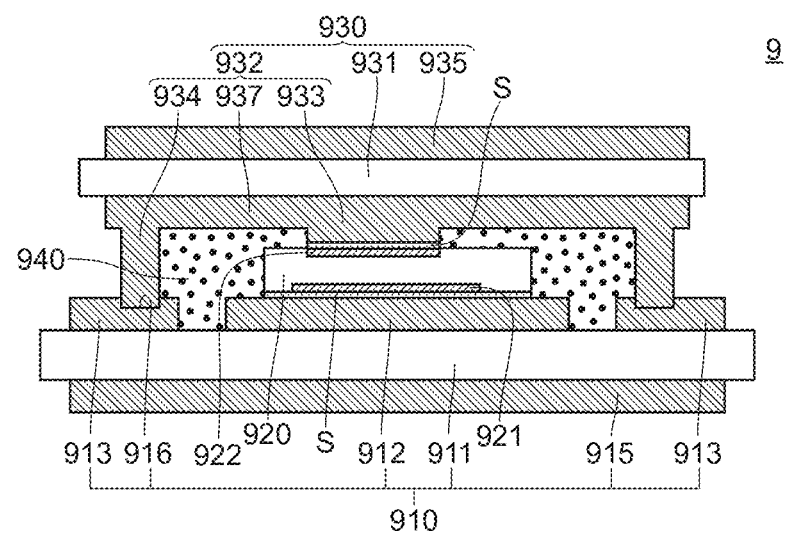
FIG. 10 is a cross-sectional view showing a semiconductor module 9 according to a prior patent application. In the drawing, symbol 913 indicates a third conductor layer, symbol 915 indicates a heat radiation conductor layer of a first substrate 910, symbol 916 indicates a groove portion, symbol 935 indicates a heat radiation conductor layer of a second substrate 930, symbol 937 indicates a flat portion, and symbol S indicates a solder.

A semiconductor module 7 of the embodiment 7 has substantially the same configuration as the semiconductor module 1 of the embodiment 1. However, the semiconductor module 7 of the embodiment 7 differs from the semiconductor module 1 of the embodiment 1 with respect to the configuration of a surrounding wall portion. That is, in the semiconductor module 7 of the embodiment 7, as shown in FIG. 8, the surrounding wall portion 34d is formed in a state where the surrounding wall portion 34d is spaced apart from a bonding portion 33d.

The first substrate 10 further includes a fourth conductor layer 13 which is bonded to the surrounding wall portion 34d at a position spaced apart from a first conductor layer 12 on one-surface side of a first insulating substrate 11, and a groove portion 16 which engages with the surrounding wall portion 34d is formed on the fourth conductor layer 13.

In this manner, the semiconductor module 7 of the embodiment 7 differs from the semiconductor module 1 of the embodiment 1 with respect to the configuration of the surrounding wall portion. However, in the same manner as the semiconductor module 1 of the embodiment 1, the first substrate 10, the power device part (semiconductor element 20), a second substrate 30d and a control IC 50 are stacked in this order. Accordingly, even in the case where the semiconductor module includes the control IC 50 which controls the power device part, it is unnecessary to secure a region where the control IC 50 is mounted on one surface side of the first insulating substrate 11 and hence, it is possible to narrow an area occupied by parts compared to the case where the control IC 50 is mounted in a juxtaposed manner with the power device part on one surface side of the first insulating substrate 11. As a result, as the semiconductor module 7 of the embodiment 7, it is possible to provide a semiconductor module which satisfies a demand for miniaturization of a product.

Further, according to the semiconductor module 7 of the embodiment 7, the surrounding wall portion 34d is formed in a state where the surrounding wall portion 34d is spaced apart from the bonding portion 33d. Accordingly, it is possible to prevent the bonding portion 33d from being short-circuited with the other conductor layers or other semiconductor elements through the surrounding wall portion 34d and hence, it is possible to provide the semiconductor module which is minimally broken.

The semiconductor module 7 of the embodiment 7 has substantially the same configuration as the semiconductor module 1 of the embodiment 1 with respect to points except for the configuration of the surrounding wall portion. Accordingly, out of the advantageous effects which the semiconductor module 1 of the embodiment 1 acquires, the semiconductor module 7 of the embodiment 7 can acquire advantageous effects brought about by the substantially same configuration.

Although the present invention has been described based on the above-mentioned embodiments heretofore, the present invention is not limited to the above-mentioned embodiments. Various modes can be carried out without departing from the gist of the present invention, and the following modifications are also conceivable, for example.

(1) The numbers, materials, shapes, positions, sizes and the like of the constitutional elements described in the above-mentioned embodiments are provided only for an exemplifying the semiconductor module according to the present invention, and can be changed within a range that advantageous effects of the present invention are not impaired.

(2) In the above-mentioned embodiments 3 to 7, the power device part has the structure where two semiconductor elements are stacked on each other. However, the present invention is not limited to such a power device part structure. For example, the power device part may have a structure where three or more semiconductor elements are stacked on each other.

(3) In the above-mentioned embodiment 5, two semiconductor elements are stacked on each other in a state where two semiconductor elements are displaced from each other by an angle of 90°. However, the present invention is not limited to such a case. For example, two semiconductor elements may be stacked on each other in a state where two semiconductor elements are displaced from each other by an angle other than 90°.

(4) In the above-mentioned respective embodiments, the first substrate is a DCB substrate. However, the present invention is not limited to such a substrate. For example, the first substrate may be a printed circuit board used in general or an aluminum substrate.

(5) In the above-mentioned respective embodiments, the second substrate is a DCB substrate. However, the present invention is not limited to such a substrate. For example, the second substrate may be a printed circuit board used in general or an aluminum substrate.

(6) In the above-mentioned respective embodiments, the heat radiation conductor layer is formed on the other surface side of the first substrate. However, the present invention is not limited to such an arrangement. A heat radiation conductor layer may not be formed.

(7) In the above-mentioned respective embodiments, the bonding portion and the surrounding wall portion are formed by etching one conductor layer. However, the present invention is not limited to such a case. The bonding portion and the surrounding wall portion may be formed by forming a bonding portion forming member and a surrounding wall portion forming member separately and by bonding these members to the second insulating substrate 31.

(8) In the above-mentioned respective embodiments, the groove portion which engages with the surrounding wall portion is formed on the third conductor layer. However, the present invention is not limited to such a case. The groove portion may not be formed on the fourth conductor layer.

The invention claimed is:
1. A semiconductor module comprising:
a first substrate having a first insulating substrate and a first conductor layer which is formed on one-surface side of the first insulating substrate;
a power device part having a first electrode on one surface thereof and a second electrode and a gate electrode on the other surface thereof, and having the first electrode electrically connected to the first conductor layer;
a second substrate having a second insulating substrate, a second conductor layer formed on one-surface side of the second insulating substrate and a third conductor layer formed on the other surface of the second insulating substrate, wherein a hole is formed in the second insulating substrate at a position corresponding to a position of the gate electrode, the second conductor layer has a bonding portion bonded to the second electrode and a surrounding wall portion having an L shape formed at a position which surrounds the bonding portion as viewed in a plan view in a state where an upper end surface of the surrounding wall portion projects from a bonding surface between the second electrode and the bonding portion, and the second substrate is brought into contact with the first substrate by way of the surrounding wall portion;
an inner resin portion made of a resin and disposed in a space defined by the surrounding wall portion and sandwiched between the first insulating substrate and the second insulating substrate;

a control IC disposed on the third conductor layer; and an outer resin portion made of a resin and disposed on the one surface side of the first substrate so as to cover the second substrate and the control IC, wherein the first substrate, the power device part, the second substrate and the control IC are stacked in this order, wherein a connecting member is disposed inside the hole formed in the second insulating substrate, and the gate electrode is electrically connected to a control signal output terminal of the control IC through the connecting member.

2. The semiconductor module according to claim 1, wherein the surrounding wall portion is formed only at a predetermined portion of a position which surrounds the bonding portion as viewed in a plan view.

3. The semiconductor module according to claim 1, wherein the surrounding wall portion is formed continuously with the bonding portion, the first substrate further has a fourth conductor layer which is bonded to the surrounding wall portion at a position spaced apart from the first conductor layer on one-surface side of the first insulating substrate, and the fourth conductor layer is electrically connected to the second electrode through the surrounding wall portion and the bonding portion.

4. The semiconductor module according to claim 3, wherein a groove portion which engages with the surrounding wall portion is formed on the fourth conductor layer.

5. The semiconductor module according to claim 1, wherein the power device part has the structure where a plurality of semiconductor elements are stacked, and at least one semiconductor element among the plurality of semiconductor elements has a first electrode on one surface thereof and has a second electrode and a gate electrode on the other surface thereof.

6. The semiconductor module according to claim 1, wherein the power device part has the structure where a plurality of semiconductor elements are stacked, the first substrate further has a fifth conductor layer disposed at a position spaced apart from the first conductor layer, and the semiconductor module further has a second connecting member which has one end thereof sandwiched between two semiconductor elements among the plurality of semiconductor elements and has the other end thereof electrically connected to the fifth conductor layer.

7. The semiconductor module according to claim 1, wherein the power device part has the structure where a plurality of semiconductor elements are stacked, each of at least two semiconductor elements among the plurality of semiconductor elements has a first electrode on one surface thereof and has a second electrode and a gate electrode on the other surface thereof, and at least one of the at least two semiconductor elements is stacked such that the gate electrode of the semiconductor element is positioned outside a region defined by the surrounding wall portion as viewed in a plan view.

8. The semiconductor module according to claim 1, wherein the bonding portion and the surrounding wall portion are formed of one copper layer.

* * * * *